United States Patent
Tsvetkov et al.

(10) Patent No.: US 7,323,052 B2
(45) Date of Patent: Jan. 29, 2008

(54) APPARATUS AND METHOD FOR THE PRODUCTION OF BULK SILICON CARBIDE SINGLE CRYSTALS

(75) Inventors: Valeri F. Tsvetkov, Durham, NC (US); David Phillip Malta, Raleigh, NC (US); Jason Ronald Jenny, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 182 days.

(21) Appl. No.: 11/089,064

(22) Filed: Mar. 24, 2005

(65) Prior Publication Data

US 2007/0283880 A1    Dec. 13, 2007

(51) Int. Cl.
    *C30B 21/04*     (2006.01)

(52) U.S. Cl. ............ 117/205; 117/84; 117/89; 117/200; 117/951; 118/716

(58) Field of Classification Search ........... 117/84, 117/951, 200, 89, 205; 118/716
See application file for complete search history.

(56) References Cited

U.S. PATENT DOCUMENTS

| | | | |
|---|---|---|---|
| RE34,861 E | 2/1995 | Davis et al. | |
| 5,895,526 A * | 4/1999 | Kitoh et al. | 117/84 |
| 5,968,261 A * | 10/1999 | Barrett et al. | 117/13 |
| 6,086,672 A | 7/2000 | Hunter | |
| 6,193,797 B1 | 2/2001 | Shiomi et al. | |
| 6,406,539 B1 | 6/2002 | Shigeto et al. | |
| 6,749,685 B2 | 6/2004 | Coleman | |
| 2002/0096108 A1 * | 7/2002 | Kuhn et al. | 117/200 |
| 2006/0144324 A1 * | 7/2006 | Sakaguchi et al. | 117/89 |

OTHER PUBLICATIONS

J. Zhang et al; "Electrically active defects in n-type 4H-silicon carbide grown in a vertical hot-wall reactor"; Journal of Applied Physics, Apr. 15, 2003; vol. 93, No. 8; pp. 4708-4714.

Y. Negoro et al; "Stability of deep centers in 4H-SiC epitaxial layers during thermal annealing"; Applied Physics Letters; Sep. 6, 2004; vol. 85, No. 10; pp. 1716-1718.

Steven Denbaars et al; "Wide-Bandgap Semiconductors for High Power, High Frequency and High Temperature"; Materials Research Society; 1998; Symposium Proceedings vol. 512; Cover page and pp. 89-99.

* cited by examiner

*Primary Examiner*—Robert Kunemund
(74) *Attorney, Agent, or Firm*—Summa, Allan & Additon, P.A.

(57) ABSTRACT

An apparatus and method for growing bulk single crystals of silicon carbide is provided. The apparatus includes a sublimation chamber with a silicon vapor species phase outlet that allows the selective passage of atomic silicon vapor species while minimizing the concurrent passage of other vapor phase species. The apparatus can provide control of vapor phase stoichiometry within the sublimation chamber, which in turn can allow the production of bulk silicon carbide single crystals with reduced intrinsic point defects concentration.

27 Claims, 1 Drawing Sheet

APPARATUS AND METHOD FOR THE PRODUCTION OF BULK SILICON CARBIDE SINGLE CRYSTALS

STATEMENT OF GOVERNMENT INTEREST

This invention was developed under Office of Naval Research/DARPA Contract No. N00014-02-C-0306. The government may have certain rights in this invention.

FIELD OF THE INVENTION

The present invention relates to an apparatus and method for the growth of bulk silicon carbide single crystals.

BACKGROUND OF THE INVENTION

Silicon carbide (SiC) is a desired material for use in the manufacture of semiconductor devices. Silicon carbide has a variety of properties useful in such devices, including a wide bandgap, a high thermal coefficient, a low dielectric constant and high temperature stability. As a result, silicon carbide materials can provide excellent semiconducting properties, and electronic devices made from silicon carbide can perform at higher temperatures as compared to devices made from other materials currently used in the industry.

Growing relatively large silicon carbide crystals, from which a large number of wafers may be produced, can be economically advantageous. Additionally, many semiconductor applications require a single crystal material with very low concentrations of intrinsic point defects in the crystal lattice and/or very low concentrations of unwanted impurities. Even in a pure material, a defective lattice structure can prevent the material from being useful for electrical devices. Certain intrinsic point defects significantly impact important fundamental properties of semiconductors crystals such as density of deep levels, minority carrier life time, carriers mobility, concentration of active donors and acceptors, dislocation distribution, stacking fault energy formation, local band gap variation, and the like.

Traditionally, two broad categories of techniques have been used for forming crystalline silicon carbide for semiconductor applications. The first of these techniques is known as chemical vapor deposition ("CVD") in which reactant gases are introduced into a system to form silicon carbide crystals upon an appropriate substrate.

The second main technique is generally referred to as sublimation. In this technique, a solid silicon carbide source material (typically a powder) is used as a starting material. The solid silicon carbide starting material is heated in a crucible until it sublimes. In particular, at process temperatures of about 1800-2400° C., the volatile species Si, $Si_2C$, and $SiC_2$ sublime from the silicon carbide source material.

The sublimed material is encouraged to condense to produce the desired crystal. This can be accomplished by introducing a silicon carbide seed crystal and SiC powder into the crucible and heating it to a temperature at which silicon carbide powder sublimes. A pioneering patent that describes methods for forming crystalline silicon carbide for semiconductor applications using such seeded sublimation techniques is U.S. Pat. No. 4,866,005 to Davis et al., issued Sep. 12, 1989, which was reissued as U.S. Pat. No. Re. 34,861, issued Feb. 14, 1995, which patents are incorporated herein by reference as if set forth in their entirety.

Despite advancements in silicon carbide crystal growth techniques, it can be difficult to control various process parameters to minimize intrinsic point defect concentrations in the resultant silicon carbide crystal. As an example, the stoichiometry of the vapor phases present within a crucible can influence crystal growth and intrinsic point defect generation. At all temperatures, the gas phase is rich in the silicon component. Conventionally, conditions within the crucible are selected to provide a Si:C vapor phase ratio that is significantly above unity to avoid graphitization and other defect-generating reactions at the growing crystal surface. See pages 16-17 of *Process Technology for Silicon Carbide Devices*, edited by Carl-Mikael Zetterling, KTH, Royal Institute of Technology, Sweden (2002).

A very high Si:C vapor phase ratio, however, generates a very high concentration of carbon vacancies in the growing SiC crystal. Point defects/complexes associated with the carbon vacancies ($Z_1Z_2$ and EH6/7) are very efficient deep recombination centers in SiC and therefore are minority carrier lifetime-limiting point defects in SiC crystals and epitaxial layers. For example, by reducing the Si:C gas phase ratio during the CVD growth of SiC epitaxial layers, it is possible to significantly reduce the concentration of $Z_1Z_2$ and EH6/7 point defects/centers in the SiC epitaxial layers and, therefore, significantly increase minority carrier lifetime. J. Zhang et al., *J. Applied Physics*, Vol. 93, No. 8, pages 4708-4714 (2003) and Y. Negoro et al., *Applied Physics Letters*, Vol. 85, No. 10, pages 1716-1718 (2004). A high minority carrier lifetime in the SiC crystal and/or epitaxial layer is very important for the design of high power SiC devices.

Sublimation processes are conventionally conducted in a closed crucible. Conducting the sublimation process in a closed crucible prevents the Si-rich gas phase from leaving the crucible and thus can aid in maintaining the Si:C ratio significantly above unity. While useful, this also provides only limited process control and further does not readily allow adjustments to the Si:C ratio as necessary during sublimation.

Therefore, a need exists to better control the stoichiometry of vapor phases within a sublimation chamber during a seeded sublimation process to minimize intrinsic point defect generation in the resultant bulk silicon carbide single crystal.

BRIEF SUMMARY OF THE INVENTION

The present invention relates to an apparatus and method for the production of bulk silicon carbide single crystals. The apparatus of the invention includes a chamber for subliming a silicon carbide source material and transporting the sublimed silicon carbide source material to a silicon carbide seed crystal growth surface. The sublimation chamber further includes a silicon carbide seed crystal for supporting the growth of a silicon carbide single crystal from the sublimed silicon carbide source material.

The sublimation chamber of the invention additionally includes a silicon vapor species outlet for allowing the preferential release of atomic silicon vapor species (e.g., Si vapor species) from within the sublimation chamber to a region outside of the sublimation chamber while retaining other vapor species inside the sublimation chamber. Advantageously, the silicon vapor species outlet preferentially releases atomic silicon vapor species at a rate sufficient to maintain a desired Si:C ratio within the sublimation chamber, typically selected to minimize the concentration of intrinsic point defects formed in the bulk silicon carbide single crystal.

The silicon vapor species outlet can be in the form of at least one opening or hole located in a portion of the sublimation chamber, typically proximate the silicon carbide seed crystal. In a particularly advantageous embodiment of the invention, the silicon vapor species outlet can be in the form of a plurality of openings or holes, each having a diameter ranging from about 0.5 to about 2 millimeters (mm), substantially uniformly distributed about the periphery of the end of the sublimation chamber to which the silicon carbide seed crystal is attached.

The silicon vapor species outlet can also include a section of the sublimation chamber formed of a material, preferably a graphite material, having a porosity sufficient to allow the preferential passage of atomic silicon vapor species from within the sublimation chamber to a region outside of the sublimation chamber without the concurrent passage of substantial amounts of other vapor species. The sublimation chamber can further include sections formed of a graphite material that is substantially impervious to the passage of vapor species.

The present invention also provides a method for growing bulk silicon carbide single crystals. The method of the invention includes the steps of introducing a silicon carbide seed crystal and a silicon carbide source material into a sublimation chamber. The method further includes the step of heating the silicon carbide source material to form vapor phase species including atomic silicon vapor species and vapor species containing both silicon and carbon atoms and causing the growth of a bulk silicon carbide single crystal on the silicon carbide seed crystal from at least a portion of the vapor phase species.

The method of the invention preferentially releases atomic silicon vapor species from the sublimation chamber while retaining other vapor species inside the sublimation chamber during the crystal growth step. Advantageously, atomic silicon vapor species are preferentially released at a rate sufficient to maintain a Si:C ratio within the sublimation chamber sufficient to minimize intrinsic point defects formed in the bulk silicon carbide single crystal.

The present invention can improve control of vapor phase stoichiometry within a sublimation chamber during a seeded sublimation process. Contrary to conventional processes, which keep high Si:C ratios by preventing vapor species from leaking from within a crucible, the present invention preferentially releases atomic silicon vapor species from within a sublimation chamber. Controlling the stoichiometry of the vapor phases during sublimation in this manner can minimize intrinsic point defect formation that can negatively impact performance of the silicon carbide crystals and devices based on them. The bulk silicon carbide single crystals produced in accordance with the present invention can accordingly exhibit improved structural, electrical and optical properties.

BRIEF DESCRIPTION OF THE DRAWING

Figure 1:
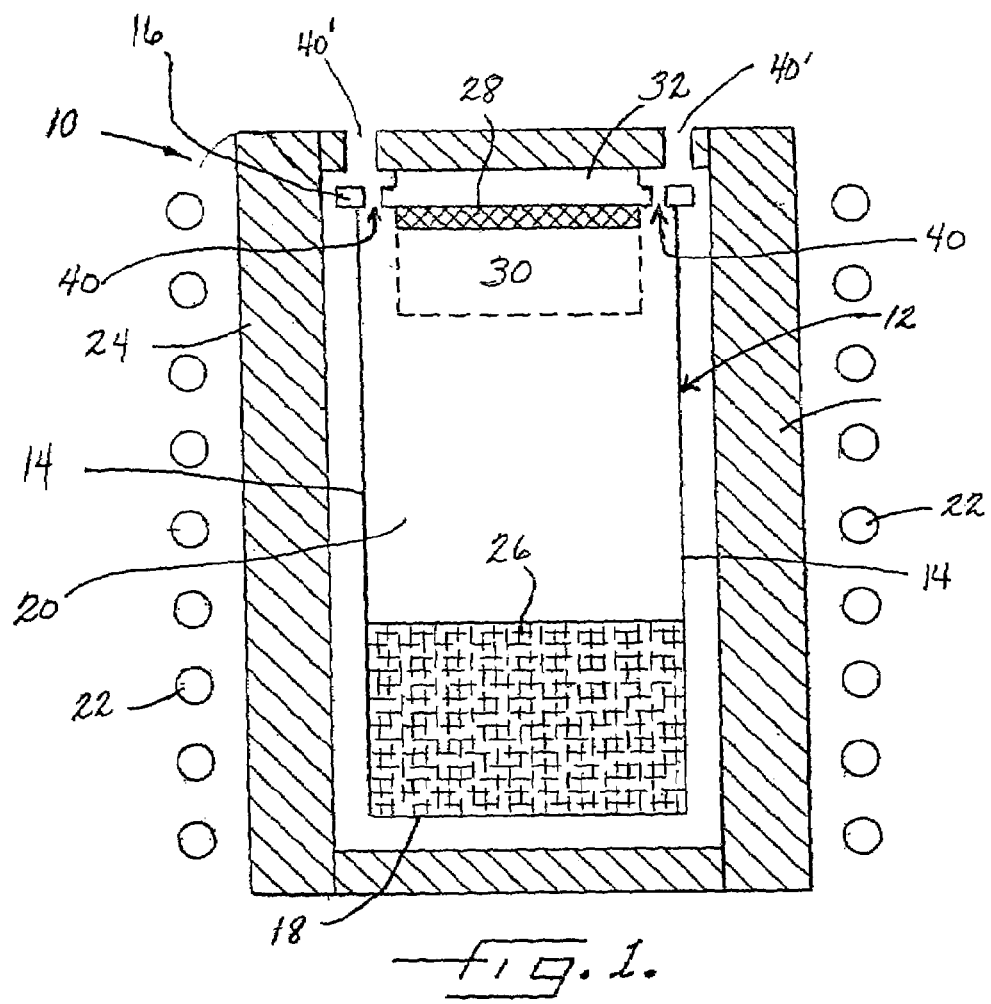

Having thus described the invention in general terms, reference will now be made to the accompanying drawing, which is not necessarily drawn to scale, and in which:

FIG. 1 is a schematic cross sectional view of a seeded sublimation system in accordance with the present invention for growing bulk silicon carbide single crystals.

DETAILED DESCRIPTION OF THE INVENTION

The present invention now will be described more fully hereinafter with reference to the accompanying drawing, in which some, but not all embodiments of the invention are shown. Indeed, this invention may be embodied in many different forms and should not be construed as limited to the embodiments set forth herein; rather, these embodiments are provided so that this disclosure will satisfy applicable legal requirements. Like numbers refer to like elements throughout.

The general aspects of seeded sublimation growth of silicon carbide have been generally well established for a number of years. Furthermore, those familiar with the growth of crystals, particularly in difficult material systems such as silicon carbide, will recognize that the details of a given technique can and will vary, usually purposefully, depending upon the relevant circumstances. Accordingly, descriptions given herein are most appropriately given in a general and schematic sense with the recognition that those persons of skill in this art will be able to carry out the invention based on the disclosures herein without undue experimentation.

FIG. 1 is a cross sectional schematic diagram of a sublimation system for seeded sublimation growth of the type contemplated as useful in the present invention. The sublimation system is broadly designated at 10. The sublimation system 10 includes a graphite crucible 12 having side walls 14 and opposing ends, for example, a lid 16 and a bottom 18. The inner surfaces of side walls 14, lid 16, and bottom 18 define a sublimation chamber 20 within crucible 12, suitable for the growth of bulk single crystal silicon carbide by sublimation, also referred to as physical vapor transport (PVT), techniques, as known in the art.

Crucible 12 advantageously has a cylindrical shape but can have any of a variety of suitable shapes. For example, crucible 12 can include four separate walls positioned to form a generally solid rectangle or cube shape. Accordingly, as used herein, reference to a wall or walls 14 of the crucible 12 includes any wall configuration suitable for creating a sublimation chamber 20, including without limitation a single continuous wall forming a substantially cylindrical shaped crucible, four separate walls forming a generally cube shaped crucible, and the like.

Sublimation system 10 can further include a plurality of induction coils 22 that heat the crucible 12 when current is applied through the coils 22. Alternatively, some systems incorporate resistance heating. It will be understood by those familiar with these crystal growth techniques that the system can be further enclosed in some circumstances, e.g., in a water-cooled quartz vessel. Additionally, at least one gas inlet and outlet (not shown) in communication with the crucible 12 are included in the seeded sublimation system 10. Such further enclosures are, however, less relevant to the invention and are omitted herein to help clarify the drawing and description. Additionally, those persons skilled in this art recognize that silicon carbide sublimation systems of the type described herein are available both commercially and as constructed in a custom fashion as may be necessary or appropriate. They accordingly can be selected or designed by those of ordinary skill in this art without undue experimentation.

The crucible 12 is typically surrounded by insulation 24, several portions of which are illustrated in FIG. 1. Although FIG. 1 illustrates the insulation 24 as being generally consistent in size and placement, it will be understood and is recognized by those of skill in the art that the placement and amount of the insulation 24 can be used to provide desired thermal gradients (both axially and radially) along the crucible 12. Again, for purposes of simplification, these possible permutations are not illustrated herein.

The crucible 12 includes one or more portions for containing a silicon carbide source material 26. The silicon carbide source material 26 is typically, although not exclusively, in powder form. FIG. 1 illustrates the silicon carbide source material 26 as being contained in a lower portion of the crucible 12, and this is one typical arrangement. As another familiar variation, some systems distribute the source material in a vertical, cylindrical arrangement in which the source material surrounds a larger portion of the interior of the crucible 12 than does the arrangement illustrated in FIG. 1. The invention described herein can be appropriately carried out using both types of equipment.

A silicon carbide seed crystal is designated at 28. As illustrated in FIG. 1, the silicon carbide seed crystal 28 is typically placed in upper portions of the crucible 12. A growing crystal 30 is deposited on the seed crystal 28 during the seeded sublimation growth.

A silicon carbide seed crystal holder 32 typically holds the seed crystal 28 in place with the seed holder 32 being attached to the crucible 12 in an appropriate fashion. The skilled artisan will appreciate, however, that the seed holder 32 can alternatively be positioned within a lower region of the crucible 12 proximate the crucible bottom 18, as a separate or integral component of the crucible 12. The seed holder 32 is preferably a graphite seed holder.

Dopant atoms can be included in the sublimation system 10. Introducing dopant gases to the seeded sublimation system 10 incorporates dopant atoms in a growing crystal. Dopants are selected for their acceptor or donor capabilities. Donor dopants are those with n-type conductivity and acceptor dopants are those with p-type conductivity. Preferred dopant atoms include n-type and p-type dopant atoms. Exemplary n-type dopants include N, P, As, Sb, Bi, and mixtures thereof. Exemplary p-type dopants include B, Al, Ga, In, Tl, and mixtures thereof.

The sublimation system 10 of the invention further includes a silicon vapor species outlet 40. The silicon vapor species outlet 40 provides fluid communication between the sublimation chamber 20 of the crucible 12 with a region outside of the sublimation chamber 20, such as the annular space illustrated in FIG. 1 between the crucible 12 and the insulation 24. The present invention, however, also includes variations of this sublimation system, for example, systems in which the crucible 12 directly contacts insulation 24. The sublimation system 10 can optionally include a secondary silicon vapor species outlet 40', which is in fluid communication with outlet 40. As a non-limiting example, the secondary silicon vapor species outlet 40' can be present in the insulation 24.

The general scheme for sublimation growth is set forth briefly in the Background portion of the specification, as well as in other sources well-known to those of ordinary skill in this art. Typically, an electric current, having a frequency to which the crucible 12 responds, is passed through the induction coils 22 to heat the graphite crucible 12. The amount and placement of the insulation 24 are selected to create a thermal gradient between the source material 26 and the growing crystal 30 when the crucible 12 heats the source material 26 to sublimation temperatures.

Typical sublimation temperatures range from about 1800-2400° C., with a temperature of about 2000° C. and higher being particularly useful for many applications. At these temperatures, volatile atomic silicon (Si) species and volatile species containing both silicon and carbon, including $Si_2C$ and $SiC_2$ vapor species, sublime from the silicon carbide source material 26. Si, $Si_2C$, and $SiC_2$ are the major components of the vapor phase present in the crucible 12 during sublimation, although other vapor components can also be present.

As used herein, the terms "atomic silicon vapor species" or "Si vapor species" refer to the atomic Si vapor species without a carbon component sublimating from the silicon carbide source material 26. Also as used herein, the term "vapor species containing both silicon and carbon atoms" includes vapor species with both silicon and carbon atoms, such as $Si_2C$ and $SiC_2$ vapor species sublimating from the silicon carbide source material 26.

The thermal gradient is established to maintain the temperature of the seed 28 and thereafter a growing crystal 30 near, but below, the temperature of the silicon carbide source to thereby thermodynamically encourage the sublimed species that are generated when silicon carbide sublimes (Si, $Si_2C$, and $SiC_2$) to condense first upon the seed crystal 28 and thereafter upon the growing crystal 30; e.g., U.S. Pat. No. 4,866,005.

After reaching the desired crystal size, growth is terminated by reducing the temperature of the system to below about 1900° C. and raising the pressure to above about 400 torr. It may be further desirable to anneal the crystal after completion of the sublimation growth process. The crystal may be annealed at temperatures above about 2500° C. for a period greater than about 30 minutes.

For purposes of clarity, the singular term, "thermal gradient," will be used herein, but it will be understood by those of skill in this art that several gradients can desirably co-exist in the crucible 12 and can be subcategorized as axial and radial gradients, or as a plurality of isotherms. If the temperature gradients and other conditions (pressure, carrier gases, etc.) are properly maintained, the overall thermodynamics will encourage the sublimed species to condense first on the seed 28 and then on the growing crystal 30 in the same polytype as the seed 28.

The silicon vapor species outlet 40 allows the atomic silicon vapor species (e.g., Si vapor species) to pass from within the sublimation chamber 20 of crucible 12 to a region outside of the crucible 12. Other vapor species which are also present within sublimation chamber 20, such as the vapor species containing silicon and carbon atoms defined above (e.g., $Si_2C$ and $SiC_2$ vapor species), however, are retained within the sublimation chamber 20. Stated differently, the silicon vapor species outlet 40 allows the selective or preferential passage of atomic silicon vapor species and concurrently prevents the passage of significant amounts of other vapor species, including vapor species including both silicon and carbon atoms.

As used herein, the term "significant amounts of other vapor species" indicates that a greater volume of atomic silicon vapor species, as compared to other vapor species, will pass through the silicon vapor species outlets 40 under sublimation conditions. Accordingly, the present invention allows for the passage of some amount of vapor species other than atomic silicon vapor species through the silicon vapor species outlet 40, so long as the dominant or majority of the vapor species passing therethrough are atomic silicon vapor species.

As used herein, the term "silicon vapor species outlet" refers to at least one, or more, crucible features configured to allow the selective or preferential passage of atomic silicon vapor species from within the sublimation chamber 20 of the crucible 12 to a region outside of the crucible 12, without the concurrent passage of substantial amounts of other vapor species. As a non-limiting example, the silicon vapor species outlet 40 can be in the form of at least one or more openings or holes in the lid 16 of the crucible, such as illustrated in FIG. 1. Alternatively, as another non-limiting example, the silicon vapor species outlet 40 can be in the form of at least one or more openings or holes in the side walls 14 of the crucible 12. In yet another non-limiting alternative, the silicon vapor species outlet 40 can be in the form of at least one or more openings or holes in the lid 16 and at least one or more openings or holes in the side walls 14.

The secondary silicon vapor species outlet 40' can also be in the form of at least one or more openings or holes, located in a portion of the sublimation system 10 in fluid communication with the silicon vapor species outlet 40. In this way, secondary silicon vapor species outlet 40' can facilitate the preferential passage of atomic silicon vapor species away from the region immediately exterior the crucible 12.

As an alternative to, or in combination with, openings or holes such as described above, the silicon vapor species outlet 40 can include at least one or more sections of the crucible 12 formed of a material having a porosity selected to allow the selective or preferential passage of atomic silicon vapor species from within the sublimation chamber 20 to a region outside of the crucible 12, without the concurrent passage of substantial amounts of other vapor species. As non-limiting examples, the silicon vapor species outlet 40 can include at least one or more sections of the side wall 14, or at least one or more sections of the lid 16, or at least one or more sections of both the sidewall 14 and the lid 16, formed of a material that allows the preferential passage of atomic silicon vapor species.

The secondary silicon vapor species outlets 40' can also be in the form of at least one or more sections of the sublimation system 10 (for example, at least one or more sections of insulation 24) formed of a material having a porosity selected to allow the preferential passage of atomic silicon vapor species from within the sublimation chamber 20 to a region outside of the crucible 12, without the concurrent passage of substantial amounts of other vapor species. Again, because the secondary silicon vapor species outlet 40' is in fluid communication with the silicon vapor species outlet 40, the secondary outlet 40' can facilitate the preferential passage of atomic silicon vapor species away from the region immediately exterior the crucible 12.

The crucible 12 is typically formed of graphite, which is commercially available in different densities. Graphite materials having different densities accordingly exhibit varying permeabilities to different vapor phase components. Graphite porosities, as well as the surface area of a section of the side wall 14 and/or the lid 16 formed of the same, are selected to permit the preferential release of atomic silicon vapor species from within the crucible interior, generally at a rate sufficient to provide and/or maintain a Si:C ratio within the sublimation chamber 20 of the crucible 12 during sublimation, typically selected to minimize intrinsic point defect formation in the growing SiC crystal. As a non-limiting example, graphite materials useful in this aspect of the invention can have a density less than 1.70 grams per cubic centimeter (g-cm$^{-3}$). Graphite materials with densities falling below this number can have the desired level of permeability to silicon vapor species and are commercially available.

The remaining sections of the crucible side walls 14 and/or lid 16 are formed of a graphite material with porosity that is different from the porosity of the graphite material forming the silicon vapor species outlet(s) 40. Generally, the remaining sections of the crucible 12 are formed of a graphite material that is substantially impervious to the passage of any of the vapor species within the crucible during sublimation. As a non-limiting example, graphite materials that do not allow the passage of vapor species can have a density greater than that of the silicon vapor species outlet. Such graphite materials are also well known in the art and are commercially available.

The preferential release of atomic silicon vapor species through the silicon vapor species outlet 40 can improve control of the stoichiometry of the vapor phase components within the sublimation chamber 20 during a sublimation process. In this regard, the silicon vapor species outlet 40 can preferentially release atomic silicon vapor species at a rate sufficient to maintain a desired Si:C ratio of vapor species within the sublimation chamber 20.

The Si:C ratio for a given sublimation process can vary, depending upon the particular requirements of the resultant silicon carbide crystal structure, such as crystal size (for example, two inch diameter, three inch diameter, or four inch diameter crystal), the desired electrical and optical properties of the resultant crystal, and the like. The Si:C ratio can also depend upon apparatus configurations and process conditions, such as but not limited to, crucible size (including crucible diameter and height), silicon vapor species outlet and/or secondary silicon vapor species outlet configurations (including shape, size, number, and location), SiC source material grain size, weight and configuration, growth temperature, temperature differentials within the crucible (including the difference between the temperature at an end of the crucible opposite the growing crystal and the temperature adjacent the growing crystal), pressure (including argon pressure), crystal growth rate, and the like Reference is made herein to V. F. Tsvetkov et al., Mat. Res. Soc. Symp. Proc. Vol. 512, "*A Theoretical and Empirical Perspective of SiC Bulk Growth*," edited by S. Denbaars et al. (Symposium held Apr. 13-15, 1998, San Francisco, Calif.), pp. 89-99, for a discussion of variables and techniques for determining vapor composition during SiC crystal growth.

The skilled artisan can readily select a Si:C ratio that is useful for a given application. The Si:C ratio is advantageously selected to minimize intrinsic point defect formation in the growing SiC crystal. Generally, a Si content proximate the growth surface of the crystal that is too high can increase the risk of defect formation via inclusion of silicon droplets. Conversely, a Si content that is too low can increase the risk of defect formation via graphitization of the crystal growth surface. Advantageously, in the present invention, the Si:C ratio within the crucible, and particularly in a region proximate or adjacent the growth surface of the SiC crystal, is about 1:1. The skilled artisan will appreciate that the 1:1 ratio can vary, and generally most applications can range from about 1:1 to about 1.6:1, with minimal adverse impact on crystal properties.

Regardless of the particular form selected for the silicon vapor species outlet 40 (and secondary silicon vapor species outlets 40' when present), outlet 40 and/or 40' can be calibrated, for example, with respect to number, size, shape, location, material porosity, surface area coverage, and the like, to allow the preferential passage of atomic silicon vapor species at a rate sufficient to maintain the desired Si:C ratio within the sublimation chamber 20. Crystal properties, apparatus configurations, and process variables, such as those set forth above, can be considered in selecting the particular characteristics of the outlets 40 and/or 40' for a given application.

One advantage of the present invention is that the invention can improve control of the Si:C ratio during a sublimation process so as to minimize variations in the Si:C ratio during sublimation, particularly in regions near the crystal growth surface. Because fluctuations in the Si:C ratio can be minimized, crystal properties can be more uniform. In contrast, prior sublimation processes typically do not allow ready control of the Si:C ratio during sublimation so that the Si:C ratio can vary during sublimation, and accordingly crystal properties can also vary.

Although not wishing to be bound by any explanation or theory of the invention, it is currently believed that the higher partial vapor pressure and higher rate of diffusion of atomic silicon vapor species, as compared to other vapor species containing both silicon and carbon atoms, result in the preferential release of the atomic silicon vapor species from the sublimation chamber 20. As a non-limiting example, at a sublimation process temperature of about 2300° C. and an argon partial pressure of zero, the partial vapor pressures and diffusion coefficients, respectively, of Si, $Si_2C$ and $SiC_2$ vapor species are: 2.5 Torr and 162 cm$^2$/s (for Si); 0.68 Torr and 42 cm$^2$/s (for $Si_2C$); and 1.96 Torr and 86 cm$^2$/s (for $SiC_2$). The higher vapor pressure and diffusion coefficient of Si vapor, as compared to $Si_2C$ and $SiC_2$ vapor, result in a much faster rate of passage of Si vapor through the outlets than the other vapor components.

Under these conditions, the inventors have found that a plurality of circular openings or holes distributed or arranged substantially uniformly about the periphery of the lid 16 of the crucible 12 can result in the preferential release of Si vapor species from the crucible 12. This, in turn, can improve control of the Si:C ratio within the crucible 12. In particular, in this non-limiting example, the crucible 12 can include two circular openings or holes up to eight circular openings or holes, each with a diameter ranging from about 0.5 to about 2 millimeters (mm), distributed substantially uniformly about the periphery of the lid 16. The present invention, however, is not limited to this example. Fewer or more openings or holes can be used, as well as openings or holes having a different shape (non-circular) and/or having a diameter outside of the noted ranges, so long as the configuration of the opening(s) or hole(s) is selected to provide a rate of loss of Si vapor species from the crucible sufficient to maintain the desired Si:C ratio within the sublimation chamber 20 of the crucible 12 during sublimation.

At least one or more silicon vapor species outlets 40 are advantageously positioned in the crucible 12 in a region near the growing face of the silicon carbide crystal 30. The silicon vapor species outlet 40 can thus provide a means of escape for excess Si vapor from the silicon rich area near the growing crystal. Locating the silicon vapor species outlet 40 near the growth surface of the crystal 30 can accordingly allow excess Si vapor to escape from the growth surface and prevent defect formation resulting from the incorporation of silicon droplets in the growth surface. This, in turn, can improve control of crystal growth as the vapor species condense on the seed crystal.

FIG. 1 illustrates an exemplary location of the silicon vapor species outlet 40 in accordance with the present invention, namely, in the lid 16 of the crucible 12. The present invention, however, is not limited to the illustrated placement. For example, the silicon vapor species outlet 40 can also be provided in other regions or sections of the crucible 12, advantageously proximate seed crystal 28 and the growing crystal 30, such as along a portion of the upper region of the side wall 14 adjacent the silicon carbide seed crystal 30. Alternatively, the silicon vapor species outlet 40 can be present along both the lid 16 and the side walls 14.

In addition, the silicon vapor species outlet 40 can be positioned in other regions of the crucible 12. As another non-limiting example, at least one or more silicon vapor species outlets 40 can be positioned along a section of the crucible 12 distal the seed crystal 28, such as along a portion of the side wall 14 close to the silicon carbide source material 26. Still further, at least one or more silicon vapor species outlets 40 can be present in multiple regions of the crucible 12, for example, along regions adjacent the seed crystal 28 well as regions distal the seed crystal 28.

The present invention also provides a method for growing bulk silicon carbide single crystals. Generally, the method of the invention is a sublimation or physical vapor transport process for the production of bulk silicon carbide single crystals. In the invention, a single seed crystal of silicon carbide having a desired polytype and a silicon carbide source material are introduced into a sublimation chamber, such as that described above with reference to FIG. 1. The silicon carbide source is typically a silicon carbide powder, but other source materials as known in the art may also be used in accordance with invention. In addition, dopants as known in the art may also be introduced into the crucible in accordance with known techniques.

The silicon carbide seed crystal has at least one surface suitable for promoting the growth of silicon carbide crystals. The seed crystal is positioned within the sublimation chamber so that the growth surface is exposed to volatilized silicon carbide source materials to allow condensation of the same on the growth surface in a manner sufficient to promote growth of the desired bulk crystal.

After the seed crystal and silicon carbide source material are introduced into the sublimation chamber, the temperature of the silicon carbide source material is raised to a temperature sufficient for silicon carbide to sublime from the source material. As the temperature of the source material is raised, the temperature of the growth surface of the seed crystal is likewise raised, typically to a temperature approaching the temperature of the source material but lower than the temperature at which silicon carbide will sublime so as to encourage condensation of the sublimed species from the source material onto the seed crystal. As a non-limiting example, the source material can be heated to a temperature of about 2000 to about 2500° C., with the seed crystal being heated to a temperature slightly lower. Temperatures lower or higher than these temperatures can also be useful so long as the reaction conditions are selected to promote the sublimation and condensation of silicon carbide to form the desired silicon carbide crystal. Other process conditions within the crucible can be controlled in accordance with known procedures in the art, including for example, vapor pressures, thermal gradients between the growth surface of the seed crystal and the source material, and the like.

During the sublimation process, a controlled portion of the atomic silicon vapor species is preferentially released from within the sublimation chamber to a region outside of the chamber, while other vapor species are retained inside the sublimation chamber. The selective release of silicon vapor species provides improved control of the stoichiometry of the vapor phase components within the chamber during the sublimation process, e.g., allows improved control of the Si:C ratio within the sublimation chamber.

In the drawing and specification there has been set forth a preferred embodiment of the invention, and although specific terms have been employed, they are used in a That which is claimed is:

1. An apparatus for the production of bulk silicon carbide single crystals, comprising:
a chamber for subliming a silicon carbide source material and transporting the sublimed silicon carbide source material to a silicon carbide crystal growth surface;
a silicon carbide seed crystal having a silicon carbide crystal growth surface within said sublimation chamber for supporting the growth of a silicon carbide single crystal from said sublimed silicon carbide source material, wherein said silicon carbide crystal growth surface is oriented substantially perpendicular to the flow of sublimed silicon carbide source material; and
a silicon vapor species outlet located in said sublimation chamber for allowing the preferential release of atomic silicon (Si) vapor species from within the sublimation chamber to a region outside of the sublimation chamber while retaining other vapor species inside the sublimation chamber.

2. The apparatus of claim 1, wherein said other vapor species comprise a vapor species containing both silicon and carbon atoms.

3. The apparatus of claim 2, wherein said vapor species containing both silicon and carbon atoms comprises at least one vapor species selected from the group consisting of $SiC_2$ vapor species, $Si_2C$ vapor species, and mixtures thereof.

4. The apparatus of claim 3, wherein said silicon vapor species outlet preferentially releases atomic Si vapor species at a rate sufficient to maintain a Si:C ratio within the sublimation chamber sufficient to minimize the concentration of intrinsic point defects formed in a bulk silicon carbide single crystal grown in the sublimation chamber.

5. The apparatus of claim 4, wherein said silicon vapor species outlet preferentially releases atomic Si vapor species at a rate sufficient to maintain a Si:C ratio within the sublimation chamber ranging from about 1:1 to about 1.6:1.

6. The apparatus of claim 1, wherein said silicon vapor species outlet is located in a region of the sublimation chamber proximate the silicon carbide seed crystal.

7. The apparatus of claim 6, wherein:
said sublimation chamber comprises a body wall and opposing ends; and
said silicon carbide seed crystal is attached to an inner surface of one of said opposing ends and oriented substantially parallel to said opposing end.

8. The apparatus of claim 7, wherein said silicon vapor species outlet is located in a section of said body wall proximate the silicon carbide seed crystal.

9. The apparatus of claim 7, wherein said silicon vapor species outlet is located in the end of the sublimation chamber attached to the silicon carbide seed crystal.

10. The apparatus of claim 9, comprising a plurality of silicon vapor species outlets distributed about the periphery of the end of the sublimation chamber attached to the silicon carbide seed crystal.

11. The apparatus of claim 7, comprising at least one silicon vapor species outlet located in the sublimation chamber body wall and at least one silicon vapor species outlet located in the end of the sublimation chamber attached to the silicon carbide seed crystal.

12. The apparatus of claim 7, wherein said silicon vapor species outlet comprises at least one opening located in said sublimation chamber.

13. The apparatus of claim 12, wherein said at least one opening has a diameter ranging from about 0.5 to about 2 millimeters.

14. The apparatus of claim 13, comprising a plurality of said openings substantially uniformly distributed about the periphery of the end of the sublimation chamber attached to the silicon carbide seed crystal.

15. The apparatus of claim 1, wherein said silicon vapor species outlet comprises a section of the sublimation chamber formed of a material having a porosity sufficient to allow the preferential passage of atomic silicon vapor species from within the sublimation chamber to a region outside of the sublimation chamber while retaining other vapor species inside the sublimation chamber.

16. The apparatus of claim 15, wherein said section of the sublimation chamber comprises a graphite material having a density less than about 1.70 grams per cubic centimeter ($g\text{-}cm^{-3}$).

17. The apparatus of claim 15, wherein the sublimation chamber further comprises a section comprising a material with porosity that is different from the porosity of the material forming said silicon vapor species outlet.

18. The apparatus of claim 17, wherein said section of the sublimation chamber comprising a material with porosity that is different from the porosity of the material forming said silicon vapor species outlet comprises a graphite material that is substantially impervious to the passage of vapor species.

19. The apparatus of claim 18, wherein said graphite material has a density greater than that of said silicon vapor species outlet.

20. A method for growing bulk silicon carbide single crystals, comprising:
introducing a silicon carbide seed crystal into a sublimation chamber;
introducing a silicon carbide source material into said sublimation chamber;
heating the silicon carbide source material to form vapor phase species comprising atomic silicon (Si) vapor species and vapor species containing both silicon and carbon atoms;
growing a bulk silicon carbide single crystal on the silicon carbide seed crystal from at least a portion of the vapor phase species; and
preferentially releasing a controlled portion of the atomic silicon vapor species from within the sublimation chamber to a region outside of the sublimation chamber while retaining other vapor species inside the sublimation chamber during said growing step.

21. The method of claim 20, wherein the step of preferentially releasing atomic silicon vapor species comprises preferentially releasing atomic silicon vapor species at a rate sufficient to maintain a Si:C ratio within the sublimation chamber sufficient to minimize the concentration of intrinsic point defects formed in the bulk silicon carbide single crystal.

22. The method of claim 21, wherein the step of preferentially releasing atomic silicon vapor species comprises preferentially releasing atomic silicon vapor species at a rate sufficient to maintain a Si:C ratio within the sublimation chamber ranging from about 1:1 to about 1.6:1.

23. An apparatus for the production of bulk silicon carbide single crystals, comprising:
a chamber for subliming a silicon carbide source material and transporting the sublimed silicon carbide source material to a silicon carbide crystal growth surface; and a silicon carbide seed crystal having a silicon carbide crystal growth surface within said sublimation chamber for supporting the growth of a silicon carbide single crystal from said sublimed silicon carbide source material;

wherein said chamber comprises a section thereof formed of a material having a porosity sufficient to allow the preferential passage of atomic silicon vapor species from within the sublimation chamber to a region outside of the sublimation chamber while retaining other vapor species inside the sublimation chamber.

24. The apparatus of claim 23, wherein said section of the sublimation chamber comprises a graphite material having a density less than about 1.70 grams per cubic centimeter (g-cm$^{-3}$).

25. The apparatus of claim 23, wherein the sublimation chamber further comprises a section comprising a material with porosity that is different from the porosity of the material forming said silicon vapor species outlet.

26. The apparatus of claim 25, wherein said section of the sublimation chamber comprising a material with porosity that is different from the porosity of the material forming said silicon vapor species outlet comprises a graphite material that is substantially impervious to the passage of vapor species.

27. The apparatus of claim 26, wherein said graphite material has a density greater than that of said silicon vapor species outlet.

* * * * *